United States Patent [19]

Ohara

[11] Patent Number: 5,825,615

[45] Date of Patent: Oct. 20, 1998

[54] IMPROVED STRUCTURE OF DRAWER TYPE COMPUTER HOUSING MOUNTING SYSTEM

[76] Inventor: Takeyoshi Ohara, 2-1, 102, 2978-6, Sugeda-Cho, Kanagawa Ku, Yokohama City, Japan

[21] Appl. No.: 932,631

[22] Filed: Sep. 17, 1997

[51] Int. Cl.$^6$ ............................... G06F 1/16; H05K 5/02
[52] U.S. Cl. ......................... 361/683; 361/725; 361/727; 312/223.3
[58] Field of Search ............................... 361/683 A, 685, 361/686, 724, 725, 727; 312/223.1, 223.2, 223.3; 364/708.1; G06F 1/16

[56] References Cited

U.S. PATENT DOCUMENTS

| | | | |
|---|---|---|---|
| 4,931,978 | 6/1990 | Drake et al. | 364/708.1 |
| 5,480,224 | 1/1996 | Ugalde | 312/194 |
| 5,563,767 | 10/1996 | Chen | 361/685 |
| 5,587,877 | 12/1996 | Ryan et al. | 361/683 |
| 5,611,608 | 3/1997 | Clausen | 312/223.3 |
| 5,651,594 | 7/1997 | Lechman | 312/194 |

Primary Examiner—Lynn D. Feild
Attorney, Agent, or Firm—Pro-Techtor International Services

[57] ABSTRACT

An improved structure of drawer type computer housing mounting system including a computer housing carrier, a computer housing carried on the computer housing, a face panel fixedly fastened to the computer housing at its front side and having openings adapted for receiving disk drivers and a CD-ROM player being mounted in holes in a front side of the computer housing, and two sliding rails fixedly fastened to two opposite lateral sides of the computer housing carrier for enabling it to be moved in and out of a desk.

1 Claim, 3 Drawing Sheets

IMPROVED STRUCTURE OF DRAWER TYPE COMPUTER HOUSING MOUNTING SYSTEM

BACKGROUND OF THE INVENTION

The present invention relates to an improved structure of drawer type computer housing mounting system which enables a computer housing to be moved in and out of a desk.

Regular table top personal computers are designed to be supported on a desk. When a table top personal computer system is used, the computer mainframe, keyboard and monitor are all carried on the top of a desk or computer table. This installation arrangement needs much table (desk) top space, and the cables of the whole computer system are disorderly laid on the table (desk) top and/or suspended from the table (desk). Furthermore, because the computer mainframe is carried on the table (desk) top, dust tends to pass to the inside of the housing of the computer mainframe.

SUMMARY OF THE INVENTION

The present invention has been accomplished to provide a computer housing mounting system which eliminates the aforesaid problems. It is one object of the present invention to provide a computer housing mounting system which is made in the form of a sliding box moved in and out of a desk without occupying any desk top space. It is another object of the present invention to provide a computer housing mounting system which is modularized for mass production. It is still another object of the present invention to provide a computer housing mounting system which permits the cables to be concealed from sight. It is still another object of the present invention to provide a computer housing mounting system which effectively protects against dust. To achieve these and other objects of the present invention, there is provided an improved structure of drawer type computer housing mounting system comprised of a computer housing carrier, which comprises two retainer blocks bilaterally raised from a bottom wall near a front side, two longitudinal sliding slots bilaterally disposed at its bottom wall near a rear side, two sliding stoppers slidably mounted in said sliding slots and fixed at the desired position, and two front mounting flanges bilaterally disposed a front side thereof, two sliding rails fixedly fastened to two opposite sides of the computer housing carrier for enabling it to be moved in and out of a desk, a computer housing carried on the computer housing carrier and stopped in place by the sliding stoppers, the computer housing comprising a plurality of air vents at a top cover shell thereof and a plurality of retaining holes at a bottom wall thereof respectively forced into engagement with the retainer blocks of said computer housing carrier, and a face panel fixedly fastened to the front mounting flanges of the computer housing carrier and having openings adapted for receiving disk drivers and a CD-ROM player being mounted in holes in a front side of the computer housing.

DETAILED DESCRIPTION OF THE PREFERRED EMBODIMENT

Figure 1:
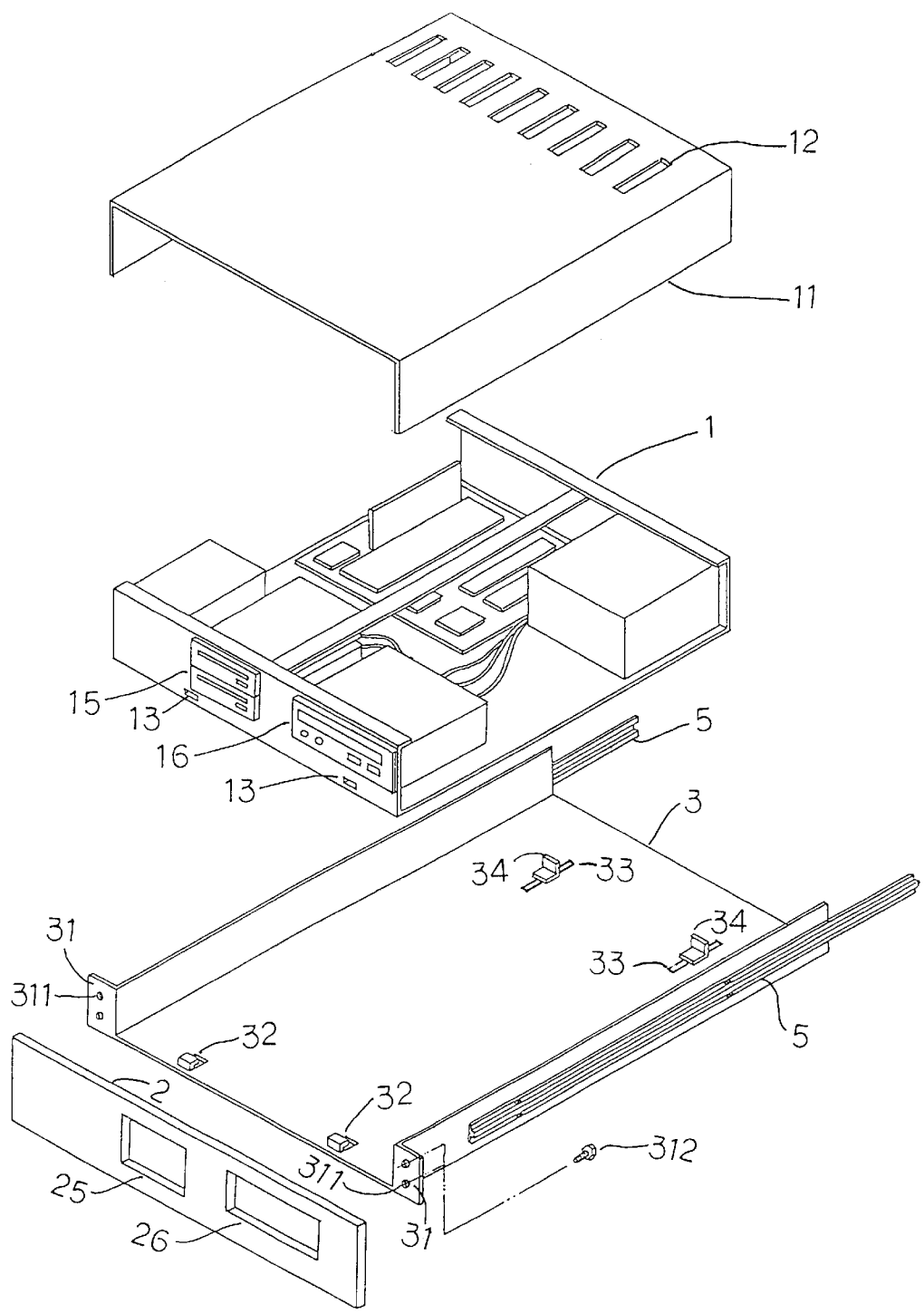
FIG. 1 is an exploded view of the present invention.

Referring to FIGS. from 1 to 3, an improved structure of drawer type computer housing mounting system in accordance with the present invention is generally comprised of a computer housing 1, a face panel 2, a computer housing carrier 3, and two sliding rails 5.

The sliding rails 5 are fixedly fastened to two opposite sides of the computer housing carrier 3 for permitting it to be moved in and out of a desk A. The computer housing 1 is carried on the computer housing carrier 3, comprising a plurality of air vents 12 at its top cover shell 11 and a plurality of for example two retaining holes 13 at its bottom wall near the front side. The computer housing carrier 3 comprises two retainer blocks 32 bilaterally raised from its bottom wall near the front side, two longitudinal sliding slots 33 bilaterally disposed at its bottom wall near the rear side, two sliding stoppers 34 slidably mounted in the sliding slots 33 and fixed at the desired position, and two front mounting flanges 31 bilaterally disposed at the front side. The front mounting flanges 31 has a plurality of through holes 311. The face panel 2 is fastened to the through holes 311 of the front mounting flanges 31 of the computer housing carrier 3 by screws 312 and covered over the front side of the computer housing carrier 3, having openings 25;26 corresponding to disk drivers 15 and a CD-ROM player 16 mounted in the computer housing 1.

Figure 2:
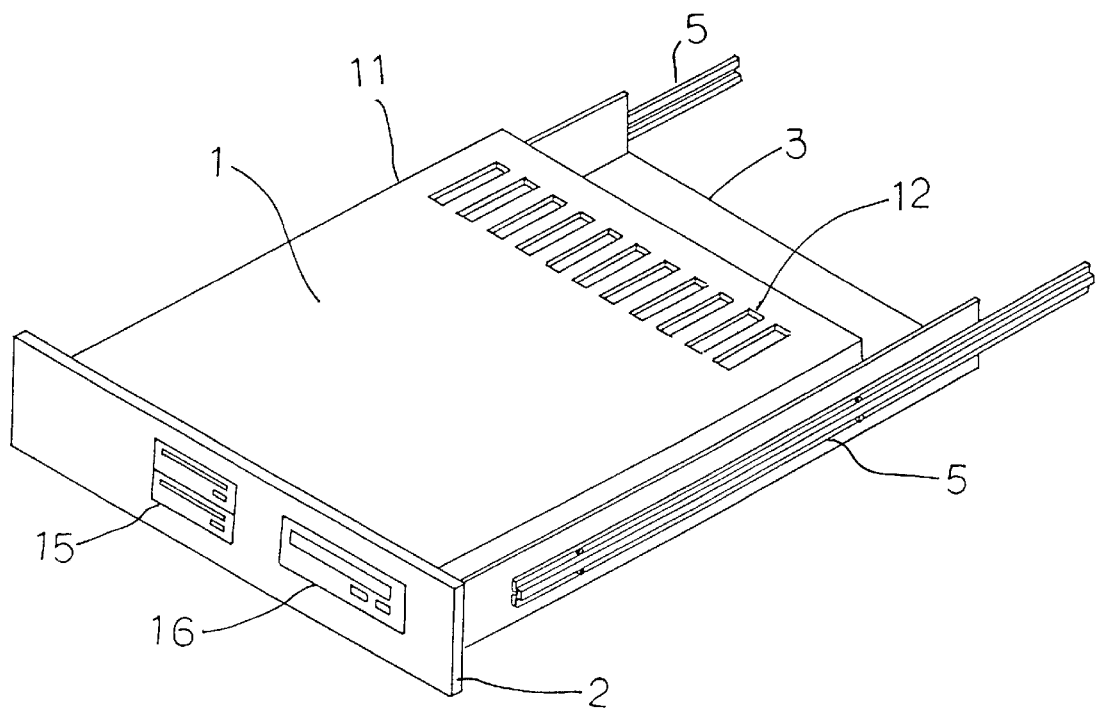
FIG. 2 is an assembly view of the system shown in FIG. 1.
Figure 3:
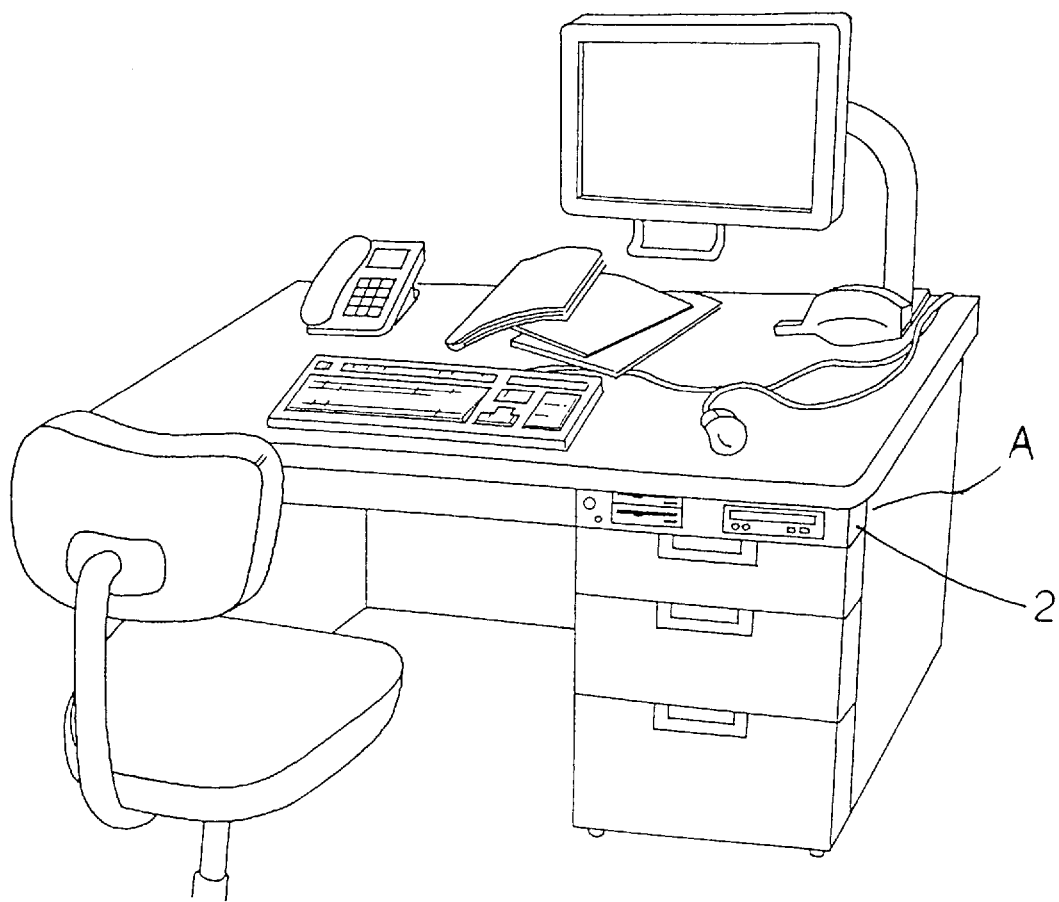
FIG. 3 is an applied view of the present invention, showing the system mounted in a desk.

The assembly process of the present invention is outlined hereinafter with reference to FIGS. from 1 to 3 again, when the computer housing 1 is mounted in the computer housing carrier 3, the retainer blocks 32 of the computer housing carrier 3 are respectively forced into engagement with the retaining holes 13 of the computer housing 1, and the sliding stoppers 34 are fixedly secured in place to stop at the rear side of the computer housing 1, and then the face panel 2 is fixedly fastened to the front mounting flanges 31 of the computer housing carrier 3 for permitting the disk drivers 15 and the CD-ROM player 16 to be exposed to the openings 25;26 of the face panel 2, and then the sliding rails 5 are fixedly fastened to the computer housing carrier 3 at its two opposite lateral sides (see FIG. 2).

When the computer housing 1, the computer housing carrier 3, the face panel 2 and the sliding rails 5 are assembled, the whole assembly is inserted into a hole (not shown) in the desk A. The desk A has a monitor supported on its desk top and connected to the mother board mounted in the computer housing 1 by a concealed cable.

As indicated above, the whole system of the present invention is made in the form of a sliding box moved in and out of a desk, therefore the whole system does not occupy any desk top space. Furthermore, because the while system is moved in and out of the desk, it is protected against dust by the desk. Of course, space for ventilation must be provided inside the desk so that heat can be dissipated from the computer system into the air.

What the invention claimed is:

1. An improved structure of drawer type computer housing mounting system comprising:

a computer housing carrier having two retainer blocks bilaterally raised from a bottom wall near a front side, two longitudinal sliding slots bilaterally disposed at its bottom wall near a rear side, two sliding stoppers slidably mounted in said sliding slots and fixed at the desired position, and two front mounting flanges bilaterally disposed a front side thereof;

two sliding rails fixedly fastened to two opposite sides of said computer housing carrier for enabling it to be moved in and out of a desk;

a computer housing carried on said computer housing carrier and stopped in place by said sliding stoppers, said computer housing comprising a plurality of air vents at a top cover shell thereof and a plurality of retaining holes at a bottom wall thereof respectively forced into engagement with the retainer blocks of said computer housing carrier; and a face panel fixedly fastened to the front mounting flanges of said computer housing carrier and having openings adapted for receiving disk drivers and a CD-ROM player being mounted in holes in a front side of said computer housing.

* * * * *